US008829953B1

(12) United States Patent
Ali et al.

(10) Patent No.: US 8,829,953 B1
(45) Date of Patent: Sep. 9, 2014

(54) PROGRAMMABLE CLOCK DIVIDER

(71) Applicants: Inayat Ali, Noida (IN); Sachin Jain, New Delhi (IN); Kanishka Patwal, Gurgaon (IN)

(72) Inventors: Inayat Ali, Noida (IN); Sachin Jain, New Delhi (IN); Kanishka Patwal, Gurgaon (IN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/151,790

(22) Filed: Jan. 9, 2014

(51) Int. Cl.

| | |
|---|---|
| ***H03K 21/00*** | (2006.01) |
| ***H03K 23/00*** | (2006.01) |
| ***H03K 25/00*** | (2006.01) |
| ***H03K 21/02*** | (2006.01) |

(52) U.S. Cl.
CPC .................................... *H03K 21/026* (2013.01)
USPC .......................................... 327/115; 327/117

(58) Field of Classification Search
CPC ......... H03K 23/68; H03K 23/667; G06F 7/68
USPC .................................................. 327/115, 117
See application file for complete search history.

(56) References Cited

U.S. PATENT DOCUMENTS

| | | | | |
|---|---|---|---|---|
| 6,278,307 | B1 | 8/2001 | El-kik | |
| 6,744,289 | B2 | 6/2004 | Nguyen | |
| 7,358,782 | B2 * | 4/2008 | Khanoyan et al. | 327/117 |
| 7,545,191 | B2 | 6/2009 | Austin | |
| 7,554,369 | B2 | 6/2009 | Kirichenko | |
| 8,004,319 | B2 * | 8/2011 | Kumar et al. | 327/115 |
| 8,093,929 | B2 | 1/2012 | Jain | |
| 8,183,895 | B2 | 5/2012 | Park | |
| 8,378,719 | B1 * | 2/2013 | Pace | 327/115 |
| 8,471,608 | B2 * | 6/2013 | Velayuthan | 327/118 |
| 2007/0040593 | A1 * | 2/2007 | Khanoyan et al. | 327/117 |
| 2013/0278303 | A1 * | 10/2013 | Chen et al. | 327/117 |

* cited by examiner

*Primary Examiner* — Adam Houston
(74) *Attorney, Agent, or Firm* — Charles Bergere

(57) ABSTRACT

A programmable clock divider includes first and second comparators for generating first and second signals respectively based on a count value of a counter and a frequency ratio value. First and second flip-flops delay the first and second signals by one clock cycle of the input clock signal. An active-low latch delays the second signal by half a clock cycle of the input clock signal. A multiplexer receives the delayed first and second signals at first and second input terminals respectively and the input clock signal at a select terminal, and generates a divided clock signal. The multiplexer outputs the second delayed signal when the input clock signal is at a logic high state and outputs the first delayed signal when the input clock signal is at a logic low state.

19 Claims, 4 Drawing Sheets

PROGRAMMABLE CLOCK DIVIDER

BACKGROUND OF THE INVENTION

The present invention relates generally to integrated circuits, and more particularly, to a programmable clock divider circuit.

Integrated circuits having various modules are widely used in computer systems for performing various functions. Examples of circuit modules include processors, logic gates, flip-flops, latches, system busses, and so forth. These circuit modules are often referred to as functional circuits and are driven by a clock signal. Depending on the system requirements, different functional circuits may require different clock signals (having different frequencies) for their operation. For example, an integrated circuit may include one set of functional circuits that operates in a first clock domain and another set that operates in a second clock domain.

An integrated circuit may include multiple clock generators that generate clock signals having different frequencies. However, having multiple clock generators occupies large area, therefore, it is preferable to have a system that includes a single clock generator that generates an input clock signal and one or more clock dividers that divide the input clock signal to generate divided clock signals. A typical clock divider receives an input signal having a frequency $f_{in}$ and generates an output signal having a frequency $f_{out}=f_{in}/n$, where n is a frequency ratio. A programmable clock divider is a type of clock divider that can be programmed to divide an input clock signal using a range of frequency ratios.

FIG. 1 shows a conventional programmable clock divider 100 that receives an input clock signal CLK_IN and generates a divided clock signal CLK_OUT. The programmable clock divider 100 includes an adder 102, a down counter 104, first and second comparators 106 and 108, an active-low latch 110, and a multiplexer or mux 112. The adder 102 is provided with a frequency ratio N−1 (externally) that is a ratio of the divided clock signal CLK_OUT and the input clock signal CLK_IN, and increments the frequency ratio N−1 by one to generate a ratio value N. The down counter 104 sets the frequency ratio N−1 as an initial count value and decrements the initial count value by one at every positive edge of the input clock signal CLK_IN to generate a count value. The first comparator 106 is connected to the adder 102 and the down counter 104 for receiving the ratio value N and count value respectively, and generating a first signal SIG_A based on a first comparison between the ratio value N and the count value. The first signal SIG_A is a pulse that has alternate logic high and low states. The first signal SIG_A is high when at least one of the conditions below is true:

(i) the ratio value N is even and the count value is greater than or equal to a first ratio value N/2, and (ii) the ratio value N is odd, and the count value is greater than or equal to a second ratio value (N/2)+1.

The second comparator 108 is connected to the adder 102 and the down counter 104 for receiving the ratio value N and count value respectively, and generating a second signal SIG_B based on a second comparison between the ratio value N and the count value. The second signal SIG_B also is a pulse signal that has alternate logic high and low states. The second signal SIG_B is high when at least one of the conditions below is true:

(i) N is even, and the count value is greater than or equal to the second ratio value (N/2)+1, (ii) N is odd, and the count value is greater than or equal to a third ratio value ((N−1)/2)+1, and (iii) N is odd and the count value is equal to zero.

The active-low latch 110 delays the second signal SIG_B by a half cycle of the input clock signal CLK_IN to generate a delayed second signal SIG_C. The mux 112 has first and second input terminals for receiving the first signal SIG_A and the delayed second signal SIG_C, a select terminal for receiving the input clock signal CLK_IN, and an output terminal for generating the divided clock signal CLK_OUT. CLK_OUT is equal to the delayed second signal SIG_C when the input clock signal CLK_IN is high and is the first signal SIG_A when the input clock signal CLK_IN is low.

FIG. 2 is a timing diagram 200 illustrating the input clock signal CLK_IN, the first and second signals SIG_A and SIG_B, the delayed second signal SIG_C, and the divided clock signal CLK_OUT. The output of the first comparator 106, i.e., the first signal SIG_A is low from time T1 to T3, transitions from low to high at time T3, and transitions from high to low at time T7, based on the conditions discussed above. Similarly, the output of the second comparator 108, i.e., the second signal SIG_B transitions from low to high at time T1, i.e., at a positive edge of the input clock signal CLK_IN and transitions from high to low at time T7, i.e., at a positive edge of the input clock signal CLK_IN based on the conditions discussed above. The output of the active-low latch 110, i.e., the delayed second signal SIG_C transitions from low to high at time T2, i.e., at a negative edge of the input clock signal CLK_IN, and from high to low at time T8, i.e., at a negative edge of the input clock signal CLK_IN.

The mux 112 selects a portion of the first signal SIG_A (from time T1 to T2) as the divided clock signal CLK_OUT from time T2 to T3, a portion of the delayed second signal SIG_C (from time T2 to T3) as the divided clock signal CLK_OUT from time T3 to T4, and a portion of the first signal SIG_A (from time T3 to T4) as the divided clock signal CLK_OUT from time T4 to T5, and so on.

The portions of the first signal SIG_A that are selected by the mux 112 have a half clock cycle of the input clock signal CLK_IN to stabilize, as they are output by the mux 112 after a delay of a half clock cycle. Similarly, the portion of the second signal SIG_B that is selected by the mux 112 has one clock cycle to stabilize, as it is output by the mux 112 after a delay of one clock cycle.

During verification of timing paths of the clock divider 100, a half-cycle timing check is required to be performed for a first timing path from the down counter 104 to the mux 112 to verify if the first signal SIG_A stabilizes in the half clock cycle. Similarly, a full-cycle timing check is required to be performed for a second timing path from the down counter 104 to the mux 112 to verify the delayed second signal SIG_C. However, the combinational logic (i.e., the first comparator 106) that is a part of the first timing path, makes it difficult and cumbersome to perform the half-cycle timing check at high frequencies (in the order of Gigahertz) of the input clock signal CLK_IN. Further, as the size and complexity of the first comparator 106 increases, it becomes impossible to perform a half-cycle timing check in the first timing path, as a large number of circuits must be verified in a limited time period (in the order of $10^{-10}$ seconds).

One solution to tackle the above-mentioned problem is to add one or more clock buffers in the path of the input clock signal CLK_IN to delay the input clock signal CLK_IN. However, adding clock buffers increases overall power consumption and clock latency of the integrated circuit and increases on-chip variations (OCVs), which introduces a new set of challenges for clock balancing.

Therefore, it would be advantageous to have a programmable clock divider that supports a half-cycle timing check using high frequency input clock signals, does not require additional clock buffers to be added in the input clock signal path, and addresses the above-mentioned limitations of existing programmable clock dividers.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements. It is to be understood that the drawings are not to scale and have been simplified for ease of understanding the invention.

DETAILED DESCRIPTION OF THE PRESENT INVENTION

Figure 1:
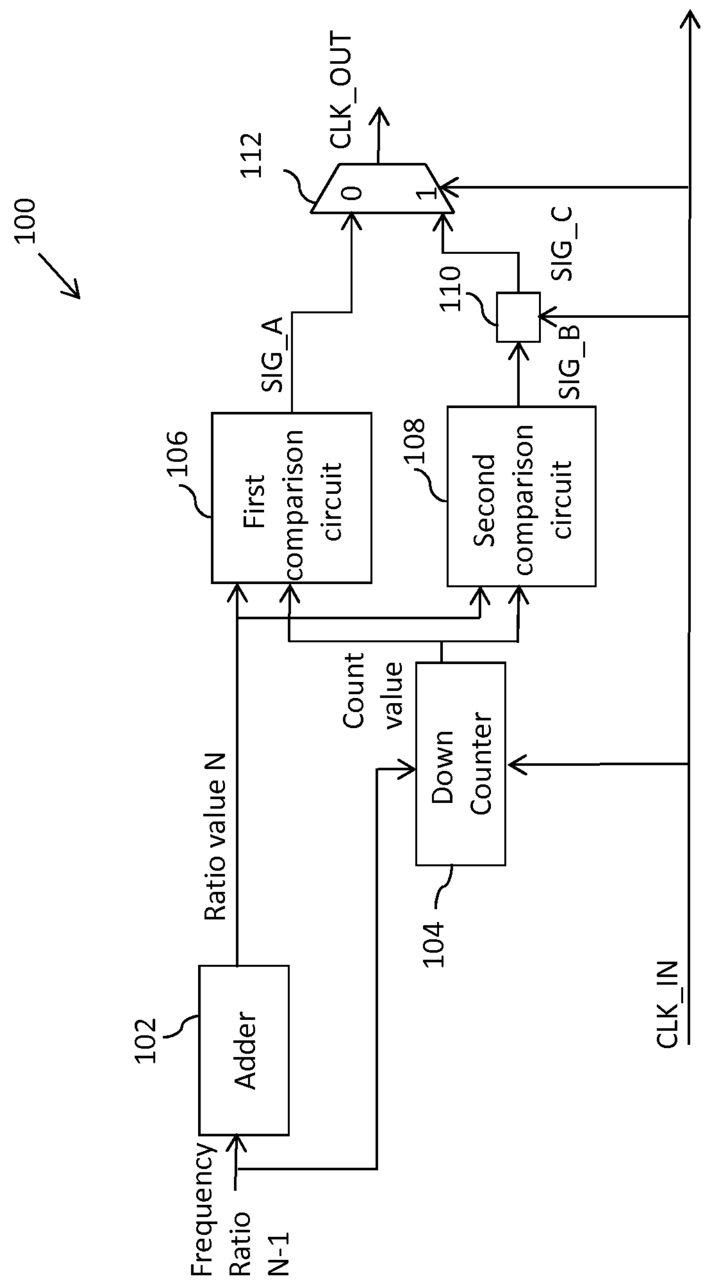
FIG. 1 is a schematic block diagram of a conventional programmable clock divider.
Figure 2:
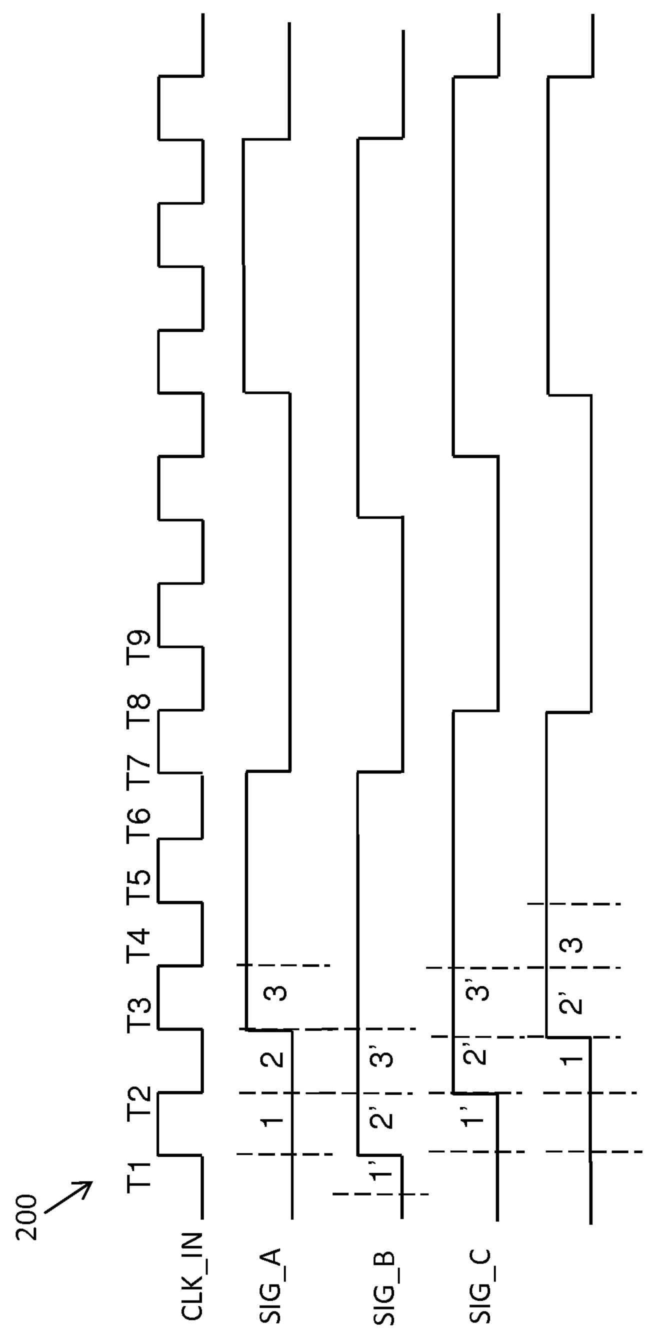
FIG. 2 is a timing diagram illustrating various signals of the conventional programmable clock divider of FIG. 1.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention. As used herein, the terms multiplexer and mux are used interchangeably.

In an embodiment of the present invention, a programmable clock divider is provided that generates a divided clock signal based on an input clock signal. The programmable clock divider includes first and second comparators, first and second flip-flops, an active-low latch and a multiplexer. The first comparator performs a first comparison between a ratio value and a count value to generate a first signal, and the second comparator performs a second comparison between the ratio value and the count value to generate a second signal. The first flip-flop has an input terminal connected to the first comparator for receiving the first signal, a clock terminal for receiving the input clock signal, and an output terminal for generating a delayed first signal. The second flip-flop has an input terminal connected to the second comparator for receiving the second signal, a clock terminal for receiving the input clock signal, and an output terminal for generating a pre-delayed second signal. The active-low latch is connected to the second flip-flop for receiving the pre-delayed second signal and generating the delayed second signal. The multiplexer has a first input terminal connected to the first flip-flop for receiving the delayed first signal, a second input terminal connected to the active-low latch for receiving the delayed second signal, a select terminal for receiving the input clock signal, and an output terminal for generating an output signal as the divided clock signal. The output signal is the second delayed signal when the input clock signal is at a logic high state and is the first delayed signal when the input clock signal is at a logic low state.

In another embodiment of the present invention, a programmable clock divider is provided for generating a divided clock signal based on an input clock signal. The programmable clock divider includes an adder, that receives a frequency ratio of the divided clock signal and an input clock signal to generate a ratio value, and a down counter connected to the clock generator, that decrements an initial count value by one at the positive edge of the input clock signal to generate the count value. The programmable clock divider further includes first and second comparators, first and second flip-flops, an active-low latch and a multiplexer. The first comparator is connected to the adder and the down counter and performs a first comparison between the ratio value and the count value to generate a first signal. The second comparator is connected to the adder and the down counter and performs a second comparison between the ratio value and the count value, to generate a second signal. The first flip-flop has an input terminal connected to the first comparator for receiving the first signal, a clock terminal for receiving the input clock signal, and an output terminal for generating a delayed first signal. The second flip-flop has an input terminal connected to the second comparator for receiving the second signal, a clock terminal for receiving the input clock signal, and an output terminal for generating a pre-delayed second signal. The active-low latch is connected to the second flip-flop and receives the pre-delayed second signal to generate the delayed second signal. The multiplexer has a first input terminal connected to the first flip-flop for receiving the delayed first signal, a second input terminal connected to the active-low latch for receiving the delayed second signal, a select terminal for receiving the input clock signal, and an output terminal for generating an output signal as the divided clock signal. The output signal is the second delayed signal when the input clock signal is at a logic high state and the output signal is the first delayed signal when the input clock signal is at a logic low state.

In various embodiments of the present invention, the first delayed signal is verified by performing a full-cycle timing check between the first comparator and the first flip-flop, the pre-delayed second signal is verified by performing a full-cycle timing check between the second comparator and the second flip-flop, and the divided clock signal is verified by performing a half-cycle timing check between the first flip-flop and the mux and a full-cycle timing check between the second flip-flop and the mux.

Various embodiments of the present invention provide a programmable clock divider that generates a divided clock signal. The clock divider includes first and second comparators that generate first and second signals based on a count value of a counter and a frequency ratio value of an input clock signal, first and second flip-flops that delay the first and second signals by one clock cycle of the input clock signal respectively, and a mux that receives the delayed first and second signals at input terminals and the input clock signal at a select terminal, and generates the divided clock signal as the output signal. During verification, a full-cycle timing check is performed for a timing path from the down counter to the first flip-flop, and a half-cycle timing check is performed for a timing path from the first flip-flop to the mux to verify the divided clock signal. The half-cycle timing check does not include verification of combinational logic of the first comparator, and is therefore easier to perform using input clock signal having frequencies of the order of GHz, because of reduced number of components and complexity. Further, the programmable clock divider of the present invention supports a half-cycle timing check without requiring additional clock buffers in the path of the input clock signal, thereby reducing power consumption, clock latency and on-chip variations thereof.

Figure 3:
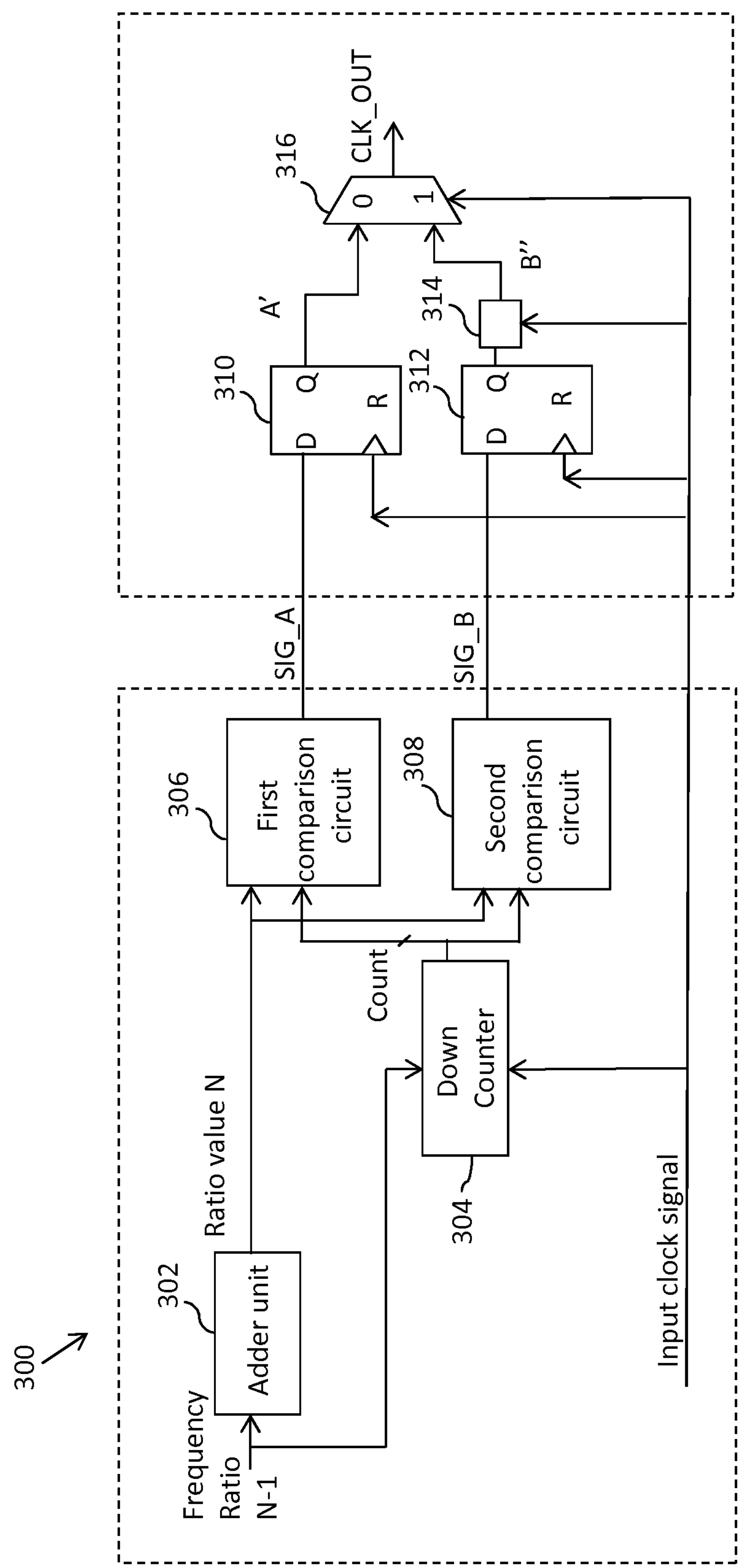
FIG. 3 is a schematic block diagram of a programmable clock divider in accordance with an embodiment of the present invention.

Referring now to FIG. 3, a schematic block diagram of a programmable clock divider 300 in accordance with an embodiment of the present invention is shown. The programmable clock divider 300 includes an adder 302, a down counter 304, first and second comparators 306 and 308, first and second flip-flops 310 and 312, an active-low latch 314, and a multiplexer or mux 316.

In various embodiments of the present invention, the programmable clock divider 300 may be used to divide a high frequency input clock signal CLK_IN by a range of frequency ratios to obtain a range of low frequency divided clock signals CLK_OUT, each having a 50% duty cycle.

The adder 302 is provided with a frequency ratio N−1 (externally) that is a ratio of the divided clock signal CLK_OUT and the input clock signal CLK_IN, and increments the frequency ratio N−1 by one to generate a ratio value N. The down counter 304 sets the frequency ratio N−1 as an initial count value and decrements the initial count value by one at every positive edge of the input clock signal CLK_IN to generate a count value. The first comparator 306 is connected to the adder 302 and the down counter 304 for receiving the ratio value N and count value respectively, and generating a first signal SIG_A based on a first comparison between the ratio value N and the count value, where the first signal SIG_A is pulse signal that has alternate logic high and low states. The first signal SIG_A is at a logic high state when at least one of the conditions below is true:

(i) N is even and the count value is greater than or equal to a first ratio value N/2, and (ii) N is odd, and the count value is greater than or equal to a second ratio value (N/2)+1

The second comparator 308 is connected to the adder 302 and the down counter 304 for receiving the ratio value N and count value respectively, and generating a second signal SIG_B based on a second comparison between the ratio value N and the count value, where the second signal SIG_B is a pulse signal that has alternate logic high and low states. The second signal SIG_B is at a logic high state when at least one of the conditions below is true:

(i) N is even, and the count value is greater than or equal to the second ratio value (N/2)+1, (ii) N is odd, and the count value is greater than or equal to a third ratio value ((N−1)/2)+1, and (iii) N is odd and the count value is equal to zero.

The first flip-flop 310 has an input terminal for receiving the first signal SIG_A, a clock terminal for receiving the input clock signal CLK_IN, and an output terminal for generating a delayed first signal SIG_A. The second flip-flop 312 has an input terminal for receiving the second signal SIG_B, a clock terminal for receiving the input clock signal CLK_IN, and an output terminal for generating a pre-delayed second signal SIG_B'. In an embodiment of the present invention, the first and second flip-flops 310 and 312 delay the first and second signals SIG_A and SIG_B by one clock cycle of the input clock signal CLK_IN respectively.

The active-low latch 314 delays the pre-delayed second signal SIG_B' by a half clock cycle of the input clock signal CLK_IN to generate a delayed second signal SIG_B". The mux 316 has first and second inputs terminals for receiving the delayed first and second signals SIG_A' and SIG_B" respectively, a select terminal for receiving the input clock signal CLK_IN, and an output terminal for generating a divided clock signal CLK_OUT as the output signal. The mux 316 outputs the delayed second signal SIG_B" as the output signal when the input clock signal CLK_IN is at a logic high state and the delayed first signal SIG_A' as the output signal when the input clock signal CLK_IN is at a logic low state. The frequency $f_{out}$ of the divided clock signal CLK_OUT is equal to $f_{in}/f_r$, where $f_{in}$ is the frequency of the input clock signal CLK_IN and $f_r$ is the frequency ratio N−1.

Figure 4:
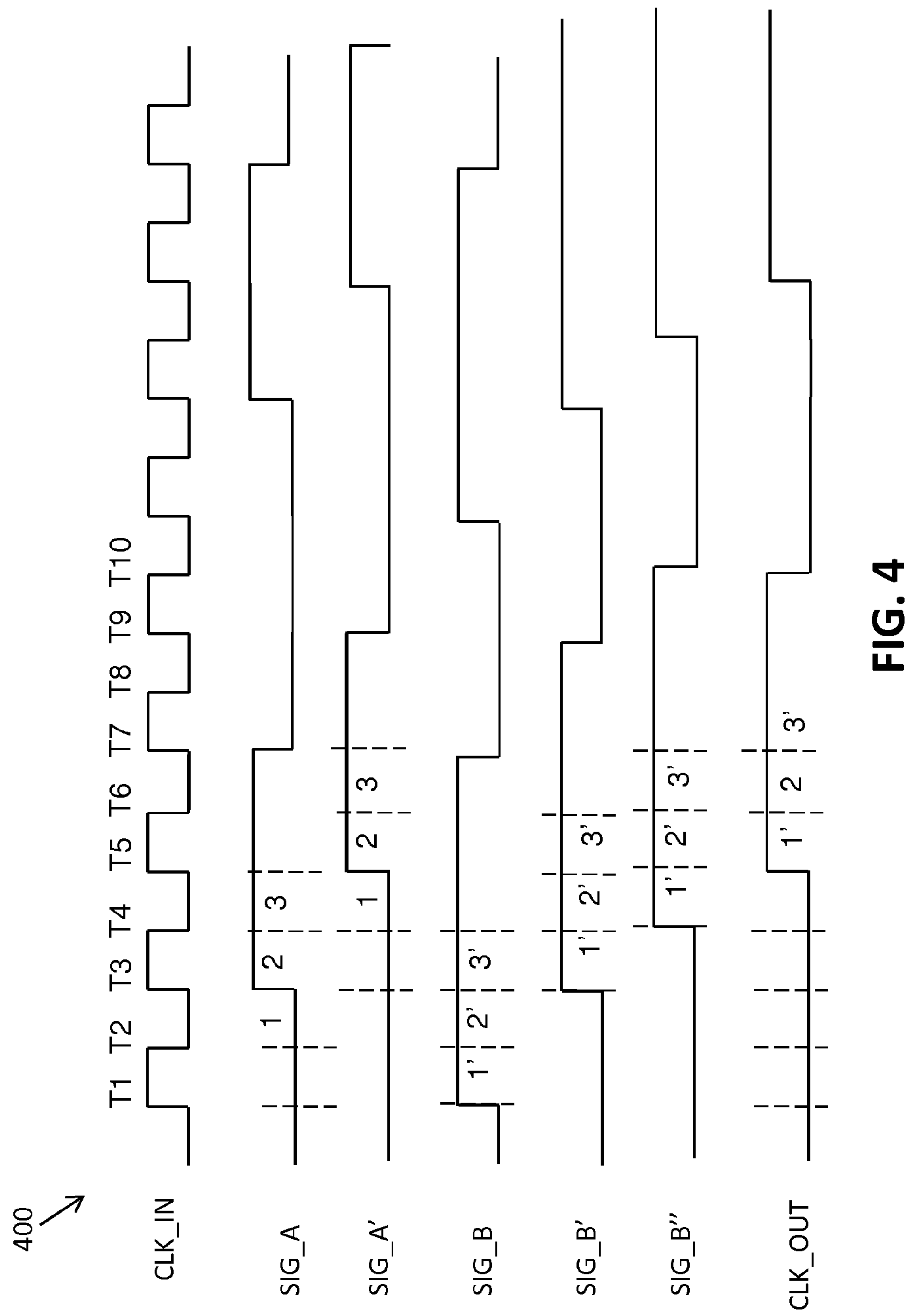
FIG. 4 is a timing diagram illustrating various signals of the programmable clock divider of FIG. 3.

FIG. 4 shows a timing diagram 400 of the input clock signal CLK_IN, the first and second signals SIG_A and SIG_B, the delayed first and second signals SIG_A' and SIG_B", the pre-delayed second signal SIG_B', and the divided clock signal CLK_OUT. The output of the first comparator 306, i.e., the first signal SIG_A stays at a logic low state from time T1 to T3, transitions from logic low to logic high at time T3, and transitions from logic high to logic low at time T7, based on the conditions described above. The output of the first flip-flop 310, i.e., the delayed first signal SIG_A', stays at the logic low until time T5, transitions from logic low to logic high at time T5, and transitions from logic high to logic low at time T9. Similarly, the output of the second comparator 308, i.e., the second signal SIG_B transitions from logic low to logic high at time T1, and transitions from logic high to logic low at T7, based on the conditions described above. The output of the second flip-flop 312, i.e., the pre-delayed second signal SIG_B', transitions from logic low to logic high at time T3, and transitions from logic high to logic at time T9. The output of the active-low latch 314, i.e., the delayed second signal SIG_B", transitions from logic high to logic low at time T4, and transitions from logic low to logic high at time T10.

The mux 316 selects a portion of the delayed second signal SIG_B" (from time T4 to T5) as the divided clock signal CLK_OUT from time T5 to T6, a portion of the delayed first signal SIG_A' (from T5 to T6) as the divided clock signal CLK_OUT from time T6 to T7, and a portion of the delayed second signal SIG_B" (from T6 to T7), as the divided clock signal CLK_OUT from time T7 to T8, and so on.

The portions of the second signal SIG_B output by the second flip-flop 312 get a full clock cycle to stabilize, as they are output by the second flip-flop 312 after a delay of one clock cycle, and the portions of the delayed second signal SIG_B" selected by the mux 316 get a full clock cycle to stabilize, as they are output by the mux 316 after a delay of one clock cycle. Similarly, the portion of the first signal SIG_A that is output by the first flip-flop 310 gets one clock cycle to stabilize, and the portion of the delayed first signal SIG_A' selected by the mux 316 gets a half clock cycle to stabilize.

During verification of timing paths of the programmable clock divider 300, a full-cycle timing check must be performed for a first timing path from the down counter 304 to the first flip-flop 310 to verify if the first signal SIG_A stabilizes in one clock cycle. Similarly, a half-cycle timing check must be performed for a second timing path from the first flip-flop 310 to the mux 316 to verify if the delayed first signal SIG_A' stabilizes in the half clock cycle. Likewise, a full-cycle timing check must be performed for a third timing path from the down counter 304 to the second flip-flop 312 to verify the second signal SIG_B, and a full-cycle timing check must be performed for a fourth timing path from the second flip-flop 312 to the mux 316 to verify the delayed second signal SIG_B".

The half-cycle timing check for the second timing path from the first flip-flop 310 to the mux 316 does not include verification of combinational logic of the first comparator 306, and therefore, can be performed easily at high frequencies of the input clock signal CLK_IN (in the order of Gigahertz) because of reduced number of components and complexity. Instead, the combinational logic of the first comparator 306 is present in the first timing path from the down counter 304 to the first flip-flop 310 and is verified using the full-cycle timing check.

It will be understood by those of skill in the art that the same logical function may be performed by different arrangements of logic gates, or that logic circuits operate using either positive or negative logic signals. Therefore, variations in the arrangement of some of the logic gates described above should not be considered to depart from the scope of the present invention.

While particular embodiments of the present invention have been shown and described, it will be recognized to those skilled in the art that, based upon the teachings herein, further changes and modifications may be made without departing from this invention and its broader aspects. For example, where signals are described as low active, it is understood that high active signals could be used and vice-versa. Thus, the appended claims are to encompass within their scope all such changes and modifications as are within the true spirit and scope of this invention.

The invention claimed is:

1. A programmable clock divider for generating a divided clock signal based on an input clock signal, comprising:

a first comparator that compares a ratio value and a count value, and generates a first signal;

a second comparator that compares the ratio value and the count value, and generates a second signal;

a first flip-flop, having an input terminal connected to the first comparator for receiving the first signal, a clock terminal for receiving the input clock signal, and an output terminal that provides a delayed first signal;

a second flip-flop, having an input terminal connected to the second comparator for receiving the second signal, a clock terminal for receiving the input clock signal, and an output terminal that provides a pre-delayed second signal;

an active-low latch, connected to the second flip-flop, that receives the pre-delayed second signal and provides a delayed second signal; and a multiplexer having a first input terminal connected to the first flip-flop for receiving the delayed first signal, a second input terminal connected to the active-low latch for receiving the delayed second signal, a select terminal for receiving the input clock signal, and an output terminal for generating the divided clock signal, wherein the second delayed signal is output by the multiplexer when the input clock signal is at a logic high state and the first delayed signal is output by the multiplexer when the input clock signal is at a logic low state.

2. The programmable clock divider of claim 1, wherein the first delayed signal is verified by performing a full-cycle timing check between the first comparator and the first flip-flop, the pre-delayed second signal is verified by performing a full-cycle timing check between the second comparator and the second flip-flop, and the divided clock signal is verified by performing a half-cycle timing check between the first flip-flop and the multiplexer and a full-cycle timing check between the second flip-flop and the multiplexer.

3. The programmable clock divider of claim 1, further comprising:

an adder, connected to the first and second comparators, that receives a frequency ratio of the divided clock signal and the input clock signal, and generates the ratio value; and a down counter, connected to the first and second comparators and the clock generator, that decrements by one from an initial count value that is equal to the frequency ratio at the positive edge of the input clock signal and generates the count value.

4. The programmable clock divider of claim 3, wherein the first signal is at a logic high state when the ratio value is even until the count value is equal to a first ratio value, wherein the first ratio value is half of the ratio value.

5. The programmable clock divider of claim 4, wherein the first signal is at a logic high state when the ratio value is odd until the count value is equal to a second ratio value, wherein the second ratio value is greater than the first ratio value by one.

6. The programmable clock divider of claim 5, wherein the second signal is at a logic high state when the ratio value is even until the count value is equal to the second ratio value.

7. The programmable clock divider of claim 5, wherein the second signal is at a logic high state when the ratio value is odd until the count value is equal to a third ratio value, wherein the third ratio value is greater than the first ratio value by one-half.

8. The programmable clock divider of claim 5, wherein the second signal is at a logic high state when the ratio value is odd and the count value is equal to zero.

9. The programmable clock divider of claim 1, wherein the first flip-flop delays the first signal by one cycle of the input clock signal to generate the delayed first signal, and the second flip-flop delays the second signal by one cycle of the input clock signal to generate the pre-delayed second signal.

10. The programmable clock divider of claim 1, wherein the active-low latch delays the pre-delayed clock signal by a half clock cycle of the input clock signal to generate the delayed second signal.

11. A programmable clock divider for generating a divided clock signal based on an input clock signal, comprising:

an adder that receives a frequency ratio of the divided clock signal and an input clock signal, and generates a ratio value;

a down counter that decrements by one from an initial count value at the positive edge of the input clock signal and generates the count value, wherein the initial count value is equal to the frequency ratio;

a first comparator, connected to the adder and the down counter, that compares the ratio value and the count value, and generates a first signal;

a second comparator, connected to the adder and the down counter, that compares the ratio value and the count value, and generates a second signal;

a first flip-flop, having an input terminal connected to the first comparator for receiving the first signal, a clock terminal for receiving the input clock signal, and an output terminal for generating a delayed first signal;

a second flip-flop, having an input terminal connected to the second comparator for receiving the second signal, a clock terminal for receiving the input clock signal, and an output terminal for generating a pre-delayed second signal;

an active-low latch, connected to the second flip-flop, that receives the pre-delayed second signal and generates a delayed second signal; and a multiplexer having a first input terminal connected to the first flip-flop for receiving the delayed first signal, a second input terminal connected to the active-low latch for receiving the delayed second signal, a select terminal for receiving the input clock signal, and an output terminal for generating the divided clock signal, wherein the multiplexer outputs the second delayed signal when the input clock signal is at a logic high state, and outputs the first delayed signal when the input clock signal is at a logic low state.

12. The programmable clock divider of claim 11, wherein the first delayed signal is verified by performing a full-cycle timing check between the first comparator and the first flip-flop, the pre-delayed second signal is verified by performing a full-cycle timing check between the second comparator and the second flip-flop, and the divided clock signal is verified by performing a half-cycle timing check between the first flip-flop and the multiplexer and a full-cycle timing check between the second flip-flop and the multiplexer.

13. The programmable clock divider of claim 11, wherein the first signal is at a logic high state when the ratio value is even until the count value is equal to a first ratio value, wherein the first ratio value is half of the ratio value.

14. The programmable clock divider of claim 12, wherein the first signal is at a logic high state when the ratio value is odd until the count value is equal to a second ratio value, wherein the second ratio value is greater than the first ratio value by one.

15. The programmable clock divider of claim 14, wherein the second signal is at a logic high state when the ratio value is even until the count value is equal to the second ratio value.

16. The programmable clock divider of claim 14, wherein the second signal is at a logic high state when the ratio value is odd until the count value is equal to a third ratio value, wherein the third ratio value is greater than the first ratio value by one-half.

17. The programmable clock divider of claim 14, wherein the second signal is at a logic high state when the ratio value is odd and the count value is equal to zero.

18. The programmable clock divider of claim 11, wherein the first flip-flop delays the first signal by one cycle of the input clock signal to generate the delayed first signal, and the second flip-flop delays the second signal by one cycle of the input clock signal to generate the pre-delayed second signal.

19. The programmable clock divider of claim 11, wherein the active-low latch delays the pre-delayed clock signal by a half clock cycle of the input clock signal to generate the delayed second signal.

* * * * *